United States Patent
Reis et al.

(10) Patent No.: US 6,744,640 B2
(45) Date of Patent: Jun. 1, 2004

(54) BOARD-LEVEL EMI SHIELD WITH ENHANCED THERMAL DISSIPATION

(75) Inventors: Bradley Reis, Landenberg, PA (US); William Candy, Middletown, DE (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 10/120,251

(22) Filed: Apr. 10, 2002

(65) Prior Publication Data

US 2003/0193794 A1 Oct. 16, 2003

(51) Int. Cl.$^7$ ................................ H05K 9/00
(52) U.S. Cl. .................. 361/818; 361/816; 361/800; 174/35 R; 174/35 GC
(58) Field of Search .................. 361/800, 816, 361/818; 174/35 R, 35 GC

(56) References Cited

U.S. PATENT DOCUMENTS

| | | | |
|---|---|---|---|
| 5,148,265 A | 9/1992 | Khandros et al. | 357/80 |
| 5,148,266 A | 9/1992 | Khandros et al. | 357/80 |
| 5,153,379 A | 10/1992 | Guzuk et al. | 174/35 |
| 5,175,613 A | 12/1992 | Barker, III et al. | 257/713 |
| 5,335,147 A | 8/1994 | Weber | 361/818 |
| 5,355,016 A | 10/1994 | Swirbel et al. | 257/659 |
| 5,367,434 A | 11/1994 | Griffin et al. | 361/719 |
| 5,436,803 A | 7/1995 | Annis et al. | 361/818 |
| 5,485,037 A * | 1/1996 | Marrs | 257/712 |
| 5,495,399 A | 2/1996 | Gore et al. | 361/818 |
| 5,552,635 A * | 9/1996 | Kim et al. | 257/706 |
| 5,597,979 A | 1/1997 | Courtney et al. | 174/35 R |
| 5,615,824 A | 4/1997 | Fjelstad et al. | 228/180.1 |
| 5,632,631 A | 5/1997 | Fjelstad et al. | 439/82 |
| 5,640,047 A | 6/1997 | Nakashima | 257/738 |
| 5,706,579 A * | 1/1998 | Ross | 29/840 |
| 5,717,245 A | 2/1998 | Pedder | 257/691 |
| 5,748,455 A | 5/1998 | Phillips et al. | 361/818 |
| 5,759,047 A | 6/1998 | Brodsky et al. | 439/66 |

(List continued on next page.)

FOREIGN PATENT DOCUMENTS

| | | |
|---|---|---|
| EP | 0 910 005 A2 | 4/1999 |
| EP | 1 008 414 A2 | 6/2000 |
| EP | 1 008 414 A3 | 8/2000 |
| WO | WO 00/13232 | 3/2000 |
| WO | WO 00/22674 | 4/2000 |
| WO | WO 01/41521 A1 | 6/2001 |

OTHER PUBLICATIONS

Ericsson's Self–Screening Approach to EMC/EMI—Electronic Engineering, May 1999, p. 14, by Ron Neale.
2000 BGA/CSP Development Update Service—TechSearch International, Inc.—Aug. 2000.

Primary Examiner—David Martin
Assistant Examiner—Dameon E. Levi
(74) Attorney, Agent, or Firm—Allan M. Wheatcraft

(57) ABSTRACT

A substrate having at least one electrical component disposed thereon; a plurality of discrete electrically conductive fastening units disposed in a pattern on the substrate surrounding the at least one electrical component; a board-level electromagnetic interference (EMI) shield comprising an electrically conductive layer; a plurality of apertures formed in the board-level EMI shield such that the apertures correspond to the pattern of the electrically conductive fastening units; with at least one thermally conductive interface (TCI) material disposed over the at least one electrical component; and wherein the electrically conductive layer of the board-level EMI shield is in electrical contact with at least one electrically conductive fastening unit.

15 Claims, 8 Drawing Sheets

U.S. PATENT DOCUMENTS

| | | | |
|---|---|---|---|
| 5,787,580 A | 8/1998 | Woo | 29/843 |
| 5,802,699 A | 9/1998 | Fjelstad et al. | 29/593 |
| 5,838,551 A | 11/1998 | Chan | 361/818 |
| 5,895,884 A | 4/1999 | Davidson | 174/35 |
| 5,939,784 A | 8/1999 | Glenn | 257/710 |
| 5,951,305 A | 9/1999 | Haba | 439/70 |
| 5,955,789 A | 9/1999 | Vendramin | 257/786 |
| 5,956,576 A * | 9/1999 | Toy et al. | 438/125 |
| 5,984,691 A | 11/1999 | Brodsky et al. | 439/66 |
| 5,990,418 A * | 11/1999 | Bivona et al. | 174/52.4 |
| 6,010,340 A | 1/2000 | Campbell et al. | 439/71 |
| 6,027,346 A | 2/2000 | Sinsheimer et al. | 439/66 |
| 6,033,235 A | 3/2000 | Ikeya | 439/71 |
| 6,034,429 A | 3/2000 | Glenn et al. | 257/701 |
| 6,037,667 A | 3/2000 | Hembree et al. | 257/779 |
| 6,051,781 A | 4/2000 | Bianca et al. | 174/35 C |
| 6,058,018 A | 5/2000 | Gerrits et al. | 361/737 |
| 6,060,659 A | 5/2000 | Borowiec et al. | 174/35 R |
| 6,069,407 A | 5/2000 | Hamzehdoost | 257/774 |
| 6,069,482 A | 5/2000 | Hilton | 324/755 |
| 6,070,785 A | 6/2000 | Ameen et al. | 228/115 |
| 6,075,255 A | 6/2000 | Liao et al. | 257/48 |
| 6,075,700 A * | 6/2000 | Houghton et al. | 361/704 |
| 6,095,842 A | 8/2000 | Lin | 439/342 |
| 6,097,609 A | 8/2000 | Kabadi | 361/760 |
| 6,097,964 A | 8/2000 | Nuovo et al. | 455/550 |
| 6,111,761 A | 8/2000 | Peana et al. | 361/818 |
| 6,122,167 A | 9/2000 | Smith et al. | 361/687 |
| 6,126,455 A | 10/2000 | Haba | 439/70 |
| 6,126,467 A | 10/2000 | Ohashi | 439/268 |
| 6,136,131 A | 10/2000 | Sosnowski | 156/256 |
| 6,137,693 A | 10/2000 | Schwiebert et al. | 361/803 |
| 6,157,546 A | 12/2000 | Petty et al. | 361/816 |
| 6,166,918 A | 12/2000 | Olofsson et al. | 361/800 |
| 6,169,665 B1 | 1/2001 | Lepping et al. | 361/800 |
| 6,169,666 B1 | 1/2001 | Venant | 361/816 |
| 6,178,097 B1 | 1/2001 | Hauk, Jr. | 361/816 |
| 6,178,318 B1 | 1/2001 | Holmberg et al. | 455/300 |
| 6,195,267 B1 | 2/2001 | MacDonald, Jr. et al. | 361/800 |
| 6,347,035 B1 | 2/2002 | Hamori et al. | 361/687 |
| 6,377,475 B1 * | 4/2002 | Reis | 361/818 |
| 2001/0046119 A1 | 11/2001 | Hamano et al. | 361/687 |

* cited by examiner

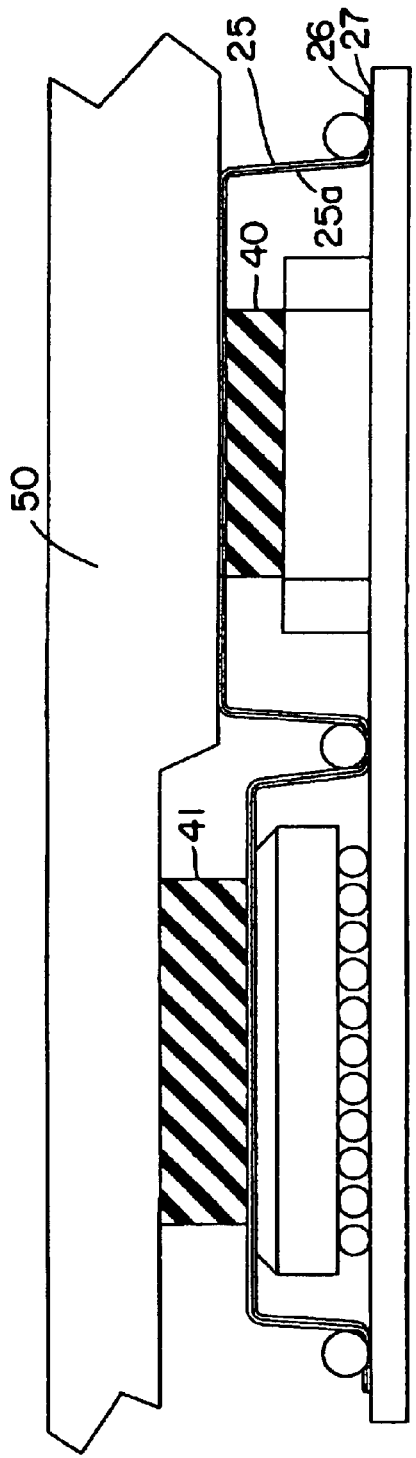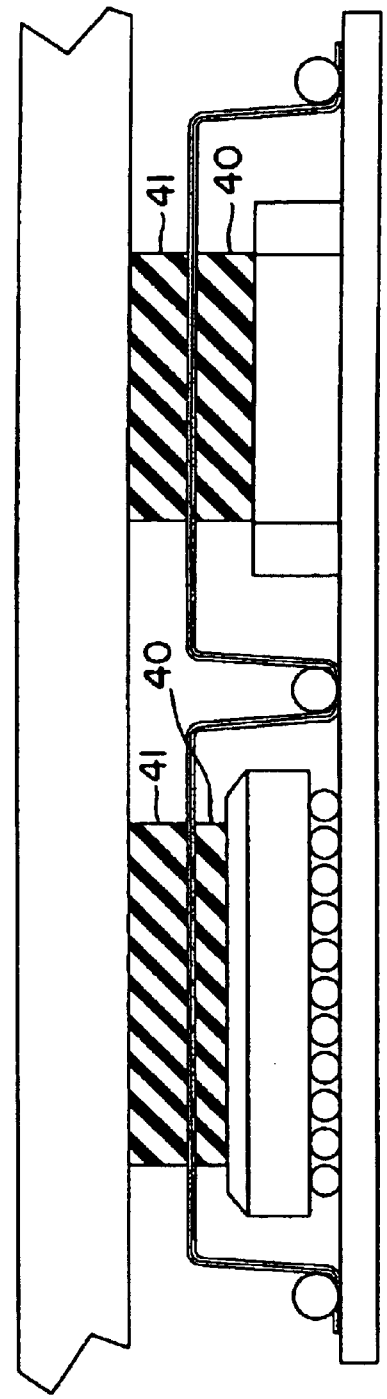

BOARD-LEVEL EMI SHIELD WITH ENHANCED THERMAL DISSIPATION

FIELD OF THE INVENTION

This invention generally relates to an improved board-level electromagnetic interference (EMI) shield for applications where heat dissipation is important. More particularly, the present invention relates to a shield that is easily removable, compatible with single or multi-compartment shield designs, thin in profile, lightweight, and promotes enhanced thermal dissipation of the shielded components. This solution is particularly advantageous for use in small electronic devices, such as cellular phones, personal digital assistants, handheld and laptop computers, among others.

BACKGROUND OF THE INVENTION

EMI shields limit electromagnetic radiation from entering or exiting sections of a printed circuit board (PCB) containing electrical components. An EMI shield is further defined to be "board-lever" if it attaches directly to the surface of a PCB, and without external or loose fasteners (such as screws or bolts), thereby eliminating a significant source of size and weight from the shielding scheme. Also as a result of this direct surface attachment to the PCB, board-level shields allow for EMI isolation of one or more sections of a PCB surface from one or more sections of the same (or other PCB's) within a given device. As with other (non-board-level) shielding schemes, board-level shields also allow for EMI isolation of one or more sections of a PCB surface on a device, from other external devices.

Often, electrical components that need to be shielded also generate heat while operating, such as power amplifiers, central processing units (CPU's), graphics chips, etc. Since the performance of these components often degrades at elevated temperatures, it is typically desirable to facilitate the transfer of heat away from them. This is typically done through the use of conduction, by utilizing a thermally conductive interface (TCI) material and a heat sink. The TCI material fills a gap in the stack-up between the component and the heat sink, and has a thermal conductivity higher than that of air, and typically as high as possible. TCI materials are often made of a conformable elastomer (such as silicone), filled with highly conductive thermal particles. The heat sink can be a finned metal block, a spreader plate comprised of sheet metal or plastic, a heat-pipe assembly, or any structure that enhances the dissipation of heat away from the electrical component and TCI material.

A common type of board-level EMI shield is known as a "can". A can is soldered to the ground trace on a PCB, directly over the electrical components that need to be shielded. Such cans offer extremely high levels of shielding effectiveness, are typically very reliable, and are well known in the industry. They are often installed in a fully automated fashion via a surface mount technology (SMT) process at the same time the components themselves are installed onto the PCB, using solder paste and a reflow process. Cans are extremely difficult to remove and replace (if the shielded components need to be reworked), because of the complicated de-soldering and re-soldering process.

Often, the components shielded by cans generate significant heat. Cans, however, require mechanical clearance (i.e. an air gap) above the components they are shielding on a PCB, to allow for proper soldering of the can to the ground trace during the reflow process. Because of this necessary clearance, a TCI material cannot be used to fill this air gap, which negatively impacts the transfer of heat away from the component to be shielded. This makes cans an undesirable solution where thermal dissipation is required.

A novel board-level shield is disclosed in U.S. patent application Ser. No. 09/793,754, of Reis, which describes a removable, multi-cavity shield, that utilizes a plurality of discrete electrically conductive fastening units, (such as BGA solder spheres) as a removable attachment mechanism. This reference, however, does not contemplate the need for improved thermal dissipation of components that are being shielded.

A technique for combining EMI shielding and thermal dissipation is disclosed in U.S. Pat. No. 6,347,035. While recognizing the need to solve both of these problems, the reference teaches only how to accomplish shielding of an entire PCB (e.g. motherboard), which necessarily includes both sides. That is, since the shielding enclosure described is not board-level, the shield cannot isolate sections of the same PCB (on the same side or opposite sides) from each other. References 5,436,803 and 5,597,979 teach similar, bag-like shielding schemes that do not shield at a board-level, and which additionally, do not contemplate the need for thermal dissipation.

Reference 5,175,613 discloses a package that combines EMI, ESD, thermal and mechanical shock protection of circuit chips. Also, reference 6,122,167 discloses an integrated hybrid cooling device with EMI shielding for a portable computer. The shielding schemes in both of these references are not board-level, however, since they do not allow for shielding sections of the same PCB from each other (e.g. one chip from another). Additionally, the solutions require an attachment mechanism involving screws or bolts, and holes that pass through the PCB. This consumes valuable PCB space, as well as adding significant weight to the design.

What has not heretofore been provided, and what is needed, is a board-level shield that is simultaneously removable, compatible with single or multi-compartment designs, thin in profile, lightweight, and allows for thermal dissipation of shielded components.

SUMMARY OF THE INVENTION

This invention provides an apparatus having a substrate having at least one electrical component disposed thereon; a plurality of discrete electrically conductive fastening units disposed in a pattern on the substrate surrounding the at least one electrical component; a board-level electromagnetic interference (EMI) shield comprising an electrically conductive layer; a plurality of apertures formed in the board-level EMI shield such that the apertures correspond to the pattern of the electrically conductive fastening units; with at least one thermally conductive interface (TCI) material disposed over the at least one electrical component; and wherein the electrically conductive layer of the board-level EMI shield is in electrical contact with at least one electrically conductive fastening unit.

In another aspect, this invention provides a substrate having at least one electrical component disposed thereon; a plurality of solder spheres disposed on the substrate surrounding the at least one electrical component; a board-level EMI shield comprising at least one compartment adapted to cover the at least one electrical component, the EMI shield further comprising an electrically conductive layer; at least one TCI material disposed over the at least one electrical component; a heat sink disposed over the at least one TCI material; wherein the electrically conductive layer of the board-level EMI shield is in electrical contact with at least one of the solder spheres, and wherein the board-level EMI shield and the solder spheres combine to limit electromagnetic radiation from entering or exiting the at least one compartment; and wherein the heat sink and the at least one TCI material combine to dissipate heat from the at least one electrical component.

In another aspect, this invention provides a board level EMI shield for a substrate having at least one electrical component disposed thereon and a plurality of discrete electrically conductive fastening units disposed in a pattern on the substrate surrounding the at least one electronic component, the board-level EMI shield comprising an electrically conductive layer; a plurality of apertures formed in the board-level EMI shield such that the apertures correspond to the pattern of the electrically conductive fastening units; at least one TCI material attached to the board-level EMI shield; wherein at least one of the apertures has a contact region and wherein the electrically conductive layer of the board-level EMI shield at the contact region of the aperture are deflectable to the extent necessary to allow the contact region to engage and retain at least one of the electrically conductive fastening units; and wherein the electrically conductive layer of the EMI shield at the contact region is adapted to make electrical contact with at least one electrically conductive fastening unit.

BRIEF DESCRIPTION OF THE DRAWINGS

FIG. 6a is a side view of another exemplary shield according to this invention.

FIG. 6b is a side view of another exemplary shield according to this invention.

DETAILED DESCRIPTION OF THE INVENTION

Figure 1:
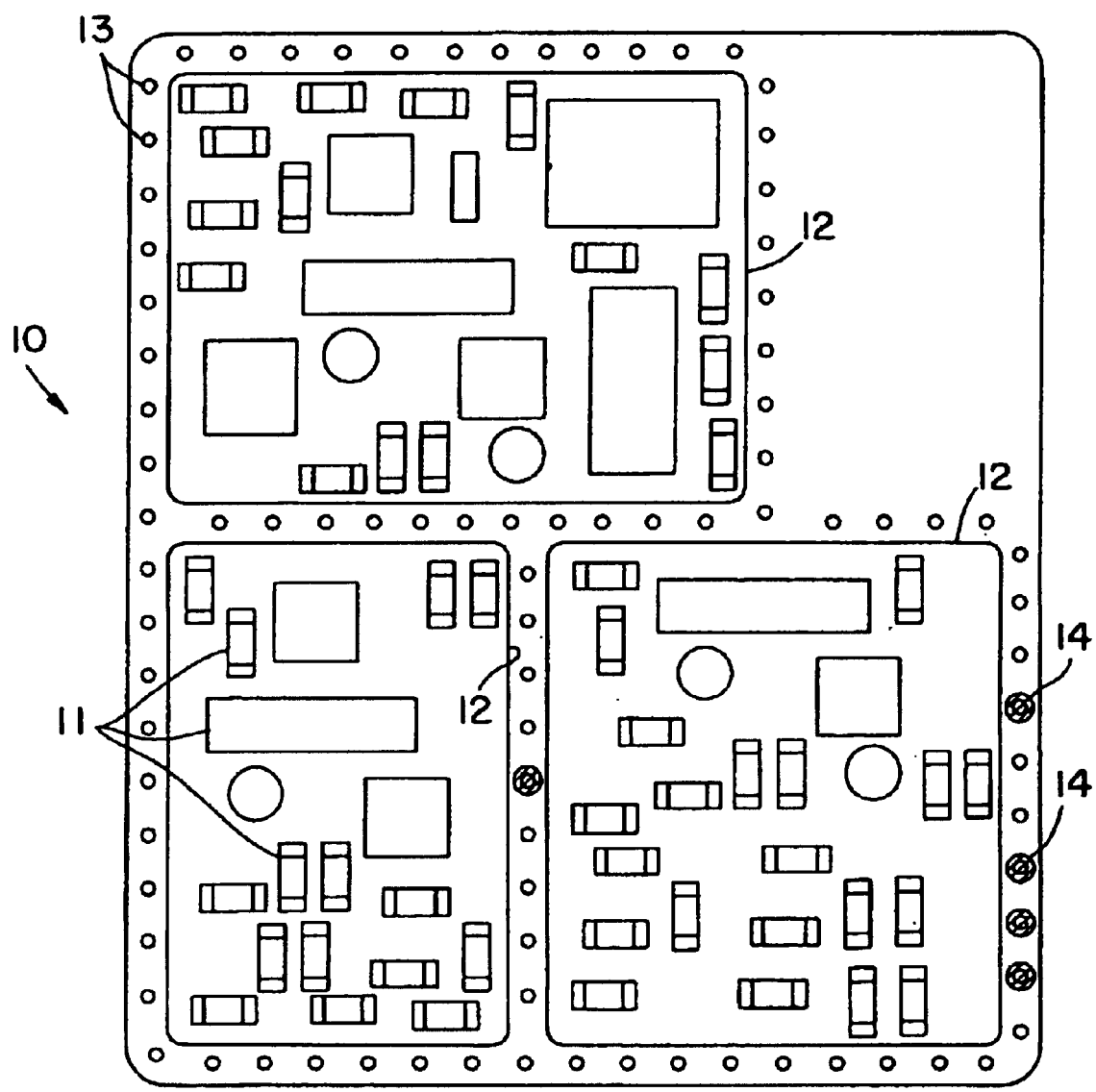
FIG. 1 is a plan view of a substrate according to an exemplary embodiment of the invention.

Referring now to the drawings, the present invention provides a board-level EMI shield that enhances thermal dissipation of the component to be shielded. FIG. 1 is a plan view of a PCB (10) according to an embodiment of this invention. PCB (10) is a substrate having a plurality of electrical components (11) grouped together in sections (12). Surrounding sections (12) are a plurality of ground trace pads (13). Disposed on each of ground trace pads (13) is an electrically conductive fastening unit (14). Electrically conductive fastening unit (14) is both mechanically and electrically coupled to ground trace pad (13), such as through the use of solder. For ease of illustration, only some of ground trace pads (13) are shown to have electrically conductive fastening units (14) disposed on them, but it is preferable that all ground trace pads (13) have an electrically conductive fastening unit (14) disposed on them. A plurality of discrete electrically conductive fastening units (14) are thus disposed on PCB (10) in a pattern surrounding sections (12).

In the preferred embodiment, electrically conductive fastening unit (14) is a solder sphere. However, electrically conductive fastening unit (14) may be any shape or material provided that it is electrically conductive, discrete, reliably mechanically and electrically attachable to a ground trace pad (13) on the PCB (10), and is also adapted to be removably mechanically and electrically attached to a shield. Other examples of electrically conductive fastening units (14) are described in U.S. patent application Ser. No. 09/793,754, of Reis, which is incorporated by reference herein.

Figure 2:
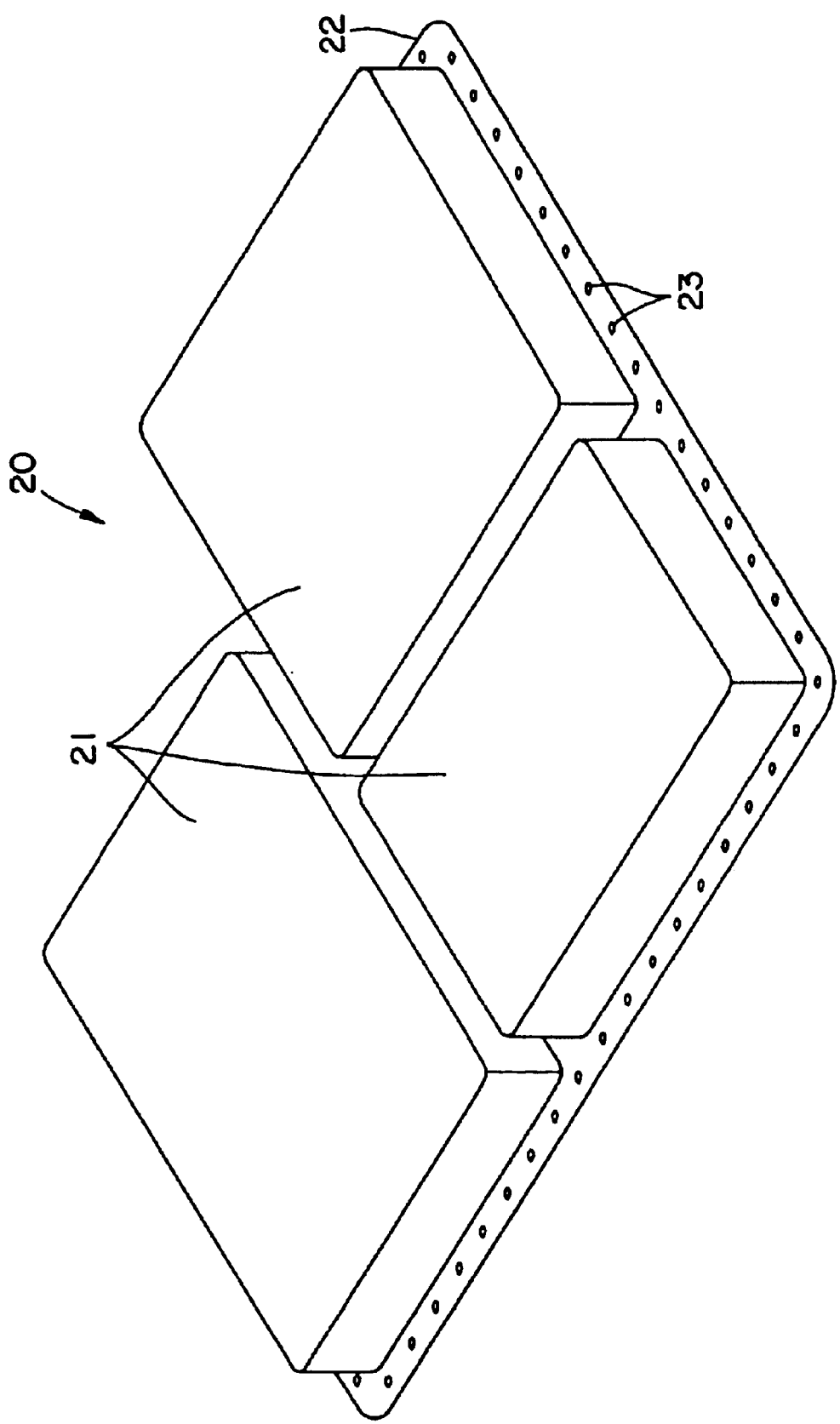
FIG. 2 is a side view of an electrically conductive fastening unit according to an exemplary embodiment of the invention.

FIG. 2 illustrates a shield (20) with compartments (21) adapted to cover sections (12) on PCB (10). Shield (20) has a flange (22) containing a plurality of apertures (23). Apertures (23) are also formed in shield (20) between compartments (21). Apertures (23) form a pattern corresponding to the pattern formed by electrically conductive fastening units (14) such that there is an aperture (23) adapted to mate with each (or substantially each) electrically conductive fastening unit (14).

Figure 3:
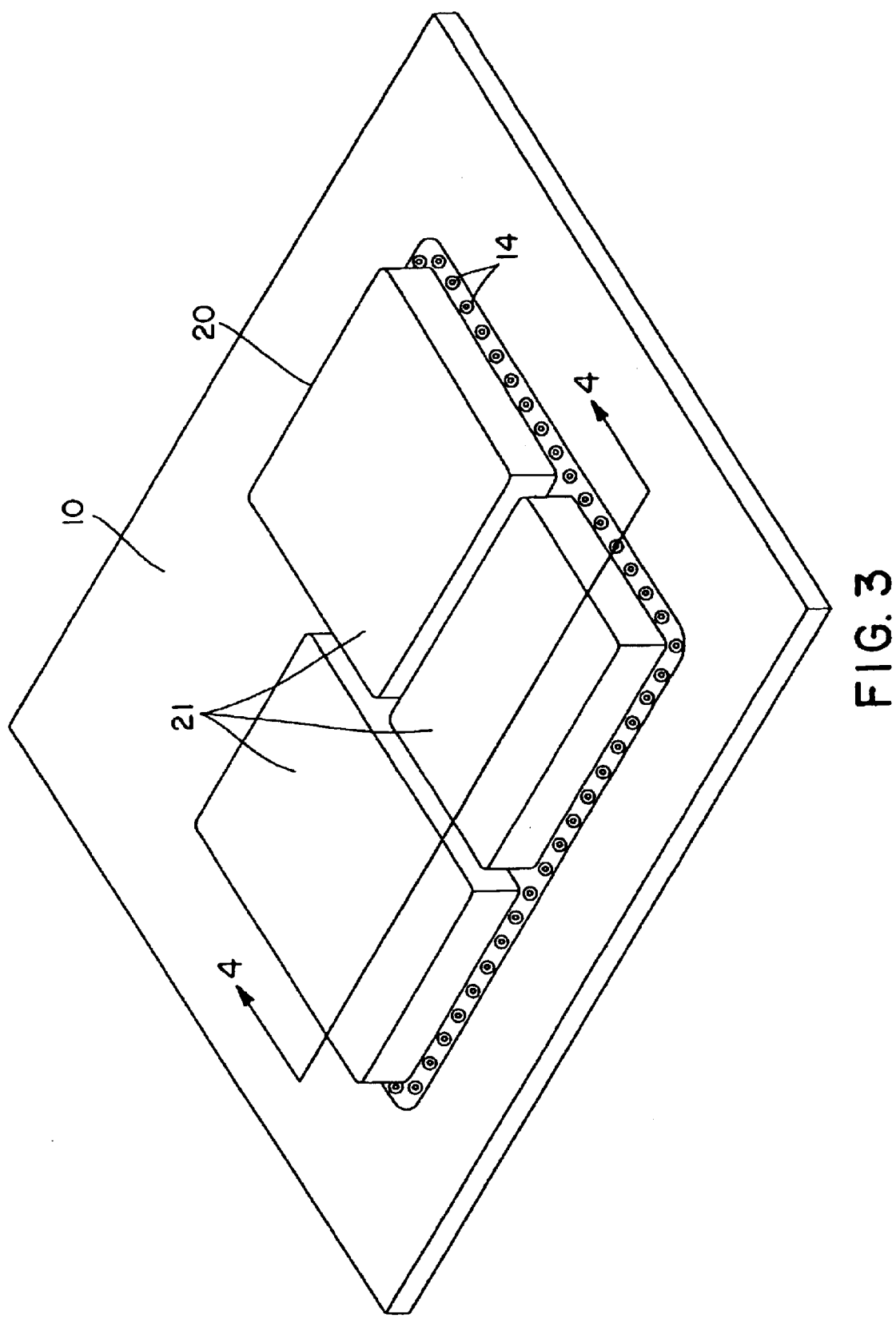
FIG. 3 is a side view of an exemplary shield according to this invention.

Shield (20) is placed over PCB (10) and attached to it as shown in FIG. 3. FIG. 3 shows electrically conductive fastening units (14) protruding through apertures (23) to provide a secure mechanical attachment of shield (20) to PCB (10). The diameter of each aperture (23) is preferably less than the greatest width of electrically conductive fastening unit (14) (for example, greater than the diameter of a solder sphere). Because electrically conductive fastening units (14) are larger than apertures (23), the attachment creates a snap or interference fit which may be easily released by pulling shield (20) away from PCB (10). Shield (20) is thus removably attached to PCB (10). As a result of the interference fit, electrically conductive fastening units (14) are thus also in electrical contact with shield (20). Further details on the snap fit are described in U.S. patent application Ser. No. 09/793,754, of Reis.

When shield (20) is in place over PCB (10) with electrically conductive fastening units (14) snap-fit into apertures (23), a board-level EMI shield is created from compartment (21) enclosing components (11) in section (12). This prevents or limits unwanted electromagnetic radiation from entering or exiting section (12).

Figure 4:
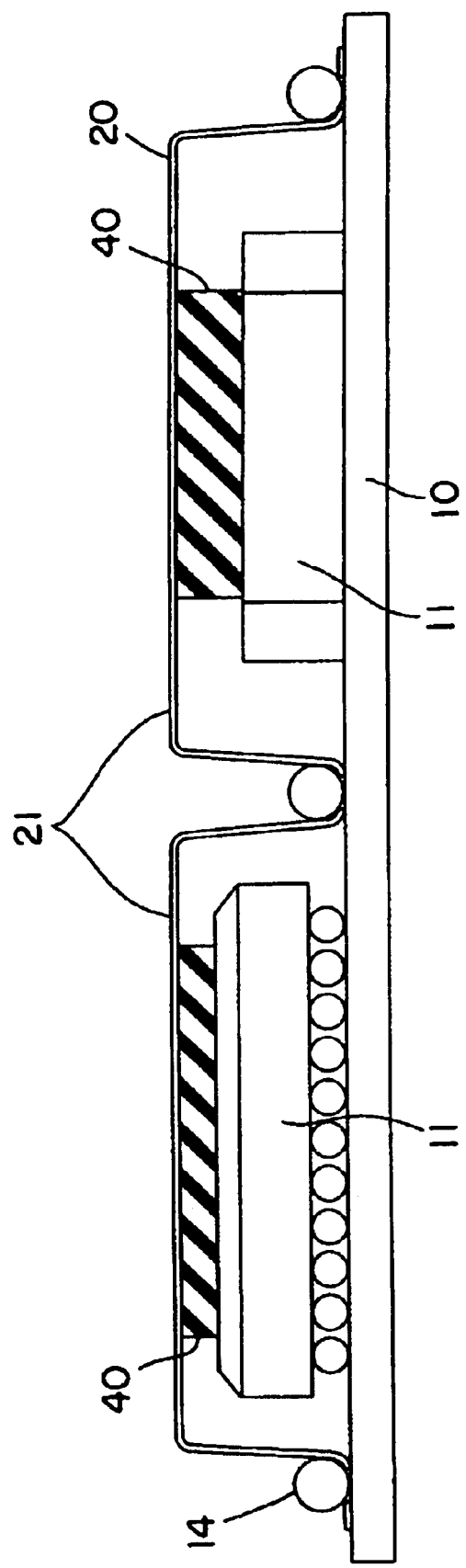
FIG. 4 is a cross-sectional view of the shield of FIG. 3.

FIG. 4 represents cross-section A—A view from FIG. 3, and shows two compartments (21), each surrounding one component (11) that requires enhanced thermal dissipation. Shield (20) is shown installed to PCB (10) by electrically conductive fastening units (14). Disposed over component (11) and under shield (20) is a TCI material (40). TCI material (40) may be an elastomer filled with thermally conductive particles, but may also be any material that has a thermal conductivity higher than that of air. Such TCI materials (40) are available under the trade names POLARCHIP®, from W. L. Gore & Associates, Inc., Cho-Therm®, from Chomerics, Div. Of Parker Hannifin Corp., and Sil-Pad® from The Bergquist Company., for example. TCI material (40) is in physical contact with both component (11) and shield (20). TCI material (40) may be attached to component (11) or shield (20) by mechanical or adhesive means (not shown). Under operation, component (11) develops heat, which is then conducted through TCI material (40) to shield (20). TCI material (40) thus helps to transfer heat to shield (20), which in this case, acts simultaneously as a heat sink to dissipate heat from component (11).

Shield (20) may be made in part from a plastic, dielectric material, filled dielectric material, metal, metal foil, metal-plated or coated dielectric material, or a combination thereof, but must comprise at least an electrically conductive layer. The electrically conductive layer may contain apertures (such as with a metal mesh), but is preferably substantially continuous. Several forming methods exist to produce such a shield (20), depending upon its construction. Thermoforming or vacuum forming are preferred methods for working with plastics, because of their low tooling costs, low manufacturing costs, and ability to form complex shield shapes in three dimensions. The most preferred plastic material for shield (20) is a material such as polycarbonate, acrylonitrile-butadiene-styrene (ABS), ABS-polycarbonate blend, polyetherimide, polytetrafluoroethylene, or expanded polytetrafluoroethylene, any of which is plated, coated, or laminated with a high-conductivity metal such as aluminum, nickel, copper, silver, tin, or combinations or alloys thereof. Alternatively, the shield (20) may be a drawn or folded metal or foil, with or without a dielectric layer coated or otherwise laminated to it. If the shield (20) is to act as a heat sink (as shown in FIG. 4), it is preferable for the shield (20) to be as thermally conductive as possible. Since most dielectrics and plastics are not very thermally conductive, it is thus desirable for the shield (20) in FIG. 4 to be made primarily of metal, and if a dielectric layer exists, it should be as thin as possible.

Figure 5:
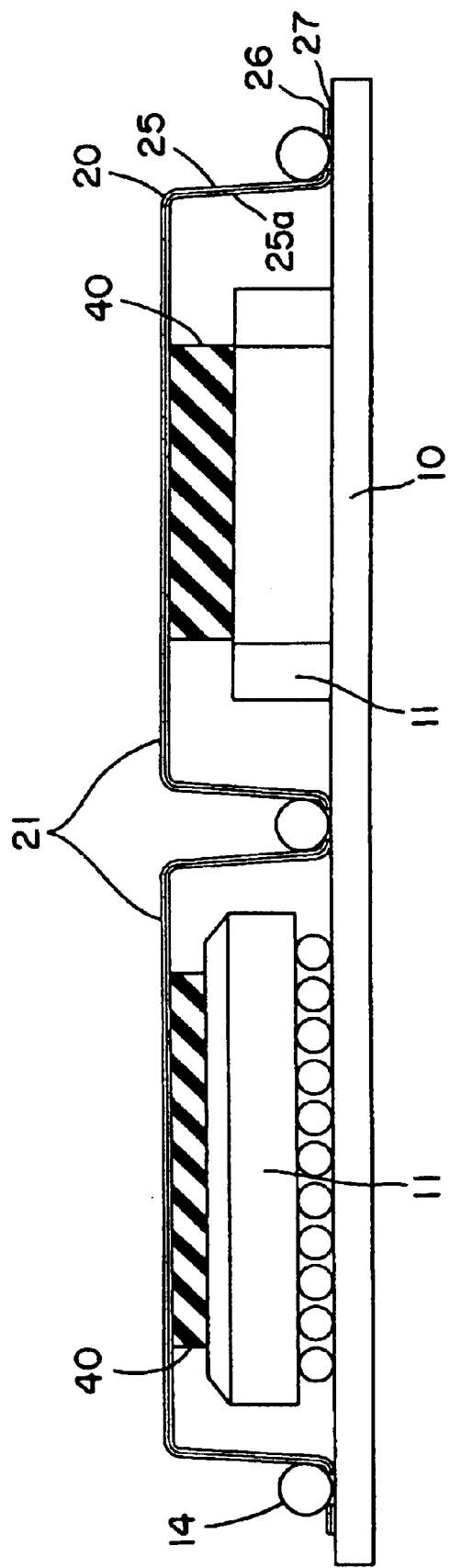
FIG. 5 is a side view of another exemplary shield according to this invention.

As shown in FIG. 5, in a preferred embodiment, shield (20) is constructed of two layers, including an optional dielectric material layer (27) and an electrically conductive layer (26). Dielectric material layer (27) has an inner surface (25a) and an outer surface (25). Electrically conductive layer (26) is disposed over at least part of outer surface (25). Dielectric material layer (27) is any material with very low electrical conductivity (for example, less than one-millionth mho/cm). Dielectric material layer (27) is also preferably as thin as possible to help maximize thermal conductivity of the shield (20). Electrically conductive layer (26) is preferably formed by a process such as sputtering, vacuum or vapor deposition, electroless plating, or electrolytic plating. Electrically conductive layer (26) is alternatively a foil laminated to outer surface (25). This two-layer arrangement is particularly advantageous since it reduces or eliminates the possibility of inner surface (25a) from making unwanted electrical contact with any components (11) on the PCB (10), even though mechanical contact may still occur. This allows for elimination of any large gaps under shield (20), which can consume valuable space in the volume of the electronic device, thereby permitting the design to be thinner. Electrically conductive layer (26) may be any material adapted to make electrical contact with electrically conductive fastening unit (14), once shield (20) is snapped in place over electrically conductive fastening unit (14). TCI material (40) is in physical contact with both component (11) and inner surface (25a) of dielectric layer (27) of shield (20). TCI material (40) may be attached to component (11) or shield (20) by mechanical or adhesive means (not shown).). Under operation, component (11) develops heat, which is then conducted through TCI material (40) to shield (20). TCI material (40) thus helps to transfer heat to shield (20). Shield (20), therefore, acts simultaneously as a heat sink to dissipate heat from component (11).

In an alternative construction to that shown in FIG. 5 (not shown), electrically conductive layer (26) is disposed over at least part of inner surface (25a), instead of outer surface (25) of dielectric material layer (27). In this case, electrically conductive layer (26) may make direct contact with ground trace pad (13) or electrically conductive fastening unit (14) through alternate snap constructions, as described in U.S. patent application Ser. No. 09/793,754, of Reis.

As shown in FIG. 6a, in a preferred embodiment, shield (20) is again constructed of two layers, including a dielectric material layer (27) and an electrically conductive layer (26) disposed over at least part of outer surface (25). Also present is a heat sink (50), which may be a finned metal block, a spreader plate comprised of sheet metal or plastic, a heat-pipe assembly, or any structure that enhances the dissipation of heat away from electrical component (11) and TCI material (40). Heat sink is in a fixed position relative to shield (20) and PCB (10) through external means (not shown). TCI material (40) is disposed over component (11) and is in physical contact with both component (11) and inner surface (25a) of dielectric layer (27) of shield (20). Alternatively, TCI material (41) is disposed over shield (20) and is in physical contact with both electrically conductive layer (26) and heat sink (50). Alternatively, as shown in FIG. 6b, TCI material (40) and (41) are simultaneously used. TCI material (40) and/or (41) may be attached to heat sink (50), component (11), or shield (20), by mechanical or adhesive means (not shown).). Under operation, component (11) develops heat, which is then conducted through TCI material (40) and/or (41) and shield (20), to heat sink (50). TCI material (40) and/or (41) thus helps to transfer heat to heat sink (50), to dissipate heat from component (11).

Figure 7:
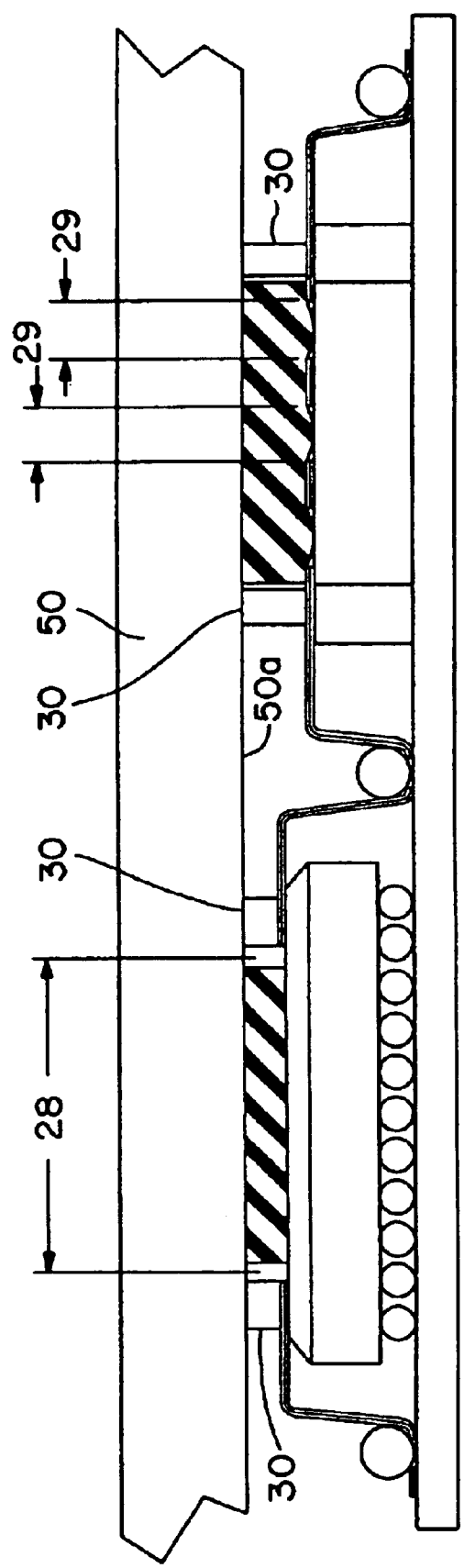
FIG. 7 is a side view of another exemplary shield according to this invention.

As shown in FIG. 7, in another preferred embodiment, shield (20) is again constructed of two layers, including a dielectric material layer (27) and an electrically conductive layer (26) disposed over at least part of outer surface (25). Also present is a heat sink (50), with an electrically conductive surface (50a). An opening (28) or group of openings (29) is positioned in shield (20) above components (11). Opening (28) or openings (29) are preferably smaller than size of component (11). Also present is an EMI gasket (30). EMI gasket (30) is a compressible, electrically conductive material, used to electrically bridge a gap between two electrically conductive surfaces. EMI gasket (30) may be an elastomer, filled with electrically conductive particles, for example. Such EMI gaskets (30) are available under the trade names GORE-SHIELD®, from W. L. Gore & Associates, Inc., and Cho-Form®, from Chomerics, Div. Of Parker Hannifin Corp., for example. EMI gasket (30) is positioned to substantially surround opening (28) or openings (29), and is in physical contact with electrically conductive layer (26) of shield (20) and electrically conductive surface (50a) of heat sink (50). EMI gasket (30) thus electrically bridges the gap between shield (20) and heat sink (50), thus eliminating a potential source of entry/exit for EMI. EMI gasket (30) may be attached to shield (20) or heat sink (50) through mechanical or adhesive means (not shown). TCI material (40) is positioned so as to at least partially pass through opening (28) or openings (29) and be in physical contact with both component (11) and surface (50a) of heat sink (50). TCI material (40) may be attached to heat sink (50), component (11), or shield (20) through mechanical or adhesive means (not shown).). Under operation, component (11) develops heat, which is then conducted through TCI material (40) to heat sink (50). TCI material (40) thus helps to transfer heat to heat sink (50), to dissipate heat from component (11).

Figure 8:
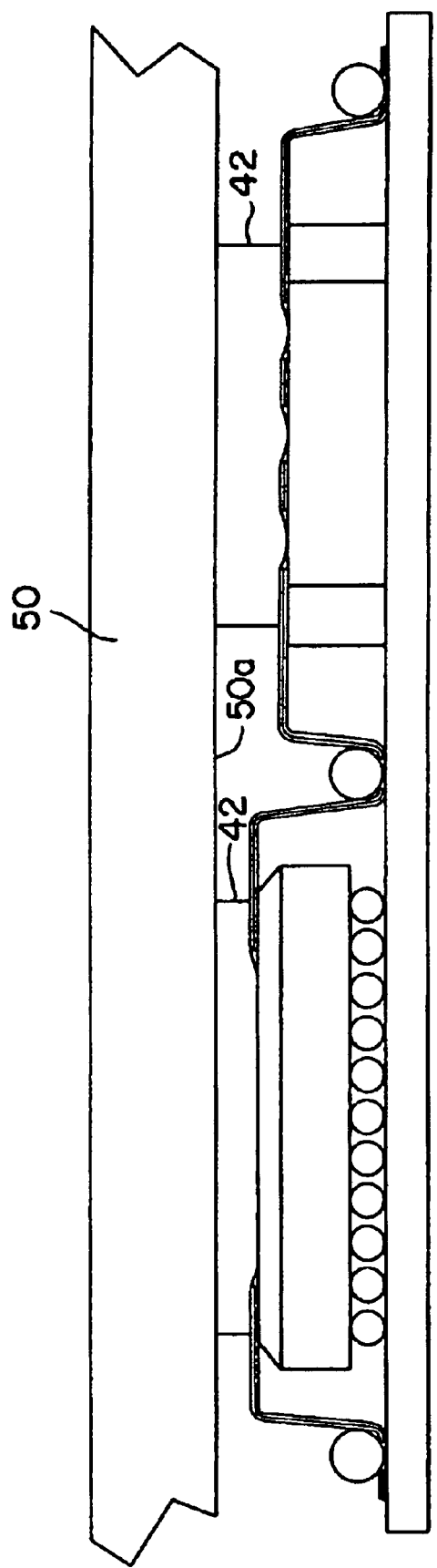
FIG. 8 is a side view of another exemplary shield according to this invention.

As shown in FIG. 8, in another preferred embodiment, shield (20) is again constructed of two layers, a dielectric material layer (27) and an electrically conductive layer (26) disposed over at least part of outer surface (25). Also present is a heat sink (50), with an electrically conductive surface (50a). An opening (28) or group of openings (29) is positioned in shield (20) above components (11). Opening (28) or group of openings (29) are preferably smaller than size of component (11). Also present is an electrically conductive TCI material (42). Electrically conductive TCI material (42) is positioned to substantially cover hole (28) or holes (29), and is in physical contact with electrically conductive layer (26) of shield (20) and electrically conductive surface (50a) of heat sink (50). Electrically conductive TCI material (42) is also positioned so as to at least partially pass through opening (28) or group of openings (29) and be in physical contact with both components (11) and surface (50a) of heat sink (50). Electrically conductive TCI material (42) may be attached to shield (20) or heat sink (50) through mechanical or adhesive means (not shown). Electrically conductive TCI material (42) thus electrically bridges the gap between shield (20) and heat sink (50) and also helps to transfer heat to heat sink (50), to dissipate heat from component (11).

While particular embodiments of the present invention have been illustrated and described herein, the present invention should not be limited to such illustrations and descriptions. It should be apparent that the changes and modifications may be incorporated and embodied as part of the present invention within the scope of the following claims.

What is claimed is:

1. An apparatus comprising:
   (a) a substrate having at least one electrical component disposed thereon;
   (b) a plurality of discrete electrically conductive fastening units disposed in a pattern on said substrate surrounding said at least one electrical component;
   (c) a board-level electromagnetic interference (EMI) shield comprising an electrically conductive layer;
   (d) a plurality of apertures formed in said board-level EMI shield such that said apertures correspond to said pattern of said electrically conductive fastening units;
   (e) at least one thermally conductive interface (TCI) material disposed over said at least one electrical component; and
   (f) wherein said electrically conductive layer of said board-level EMI shield is in electrical contact with at least one said electrically conductive fastening units.

2. An apparatus as defined in claim 1 wherein at least one of said apertures has a contact region and wherein said electrically conductive layer of said board-level electromagnetic interference (EMI) shield is deflectable to the extent necessary to allow said contact region to engage and retain at least one of said electrically conductive fastening units.

3. An apparatus as defined in claim 1 wherein at least one of said electrically conductive fastening units is a solder sphere.

4. An apparatus as defined in claim 1 wherein said board-level electromagnetic interference (EMI) shield further comprises a dielectric material layer.

5. An apparatus as defined in claim 4 wherein said dielectric material layer has an outer surface, and wherein said electrically conductive layer is disposed on said outer surface of said dielectric material layer.

6. An apparatus as defined in claim 1 wherein said electrically conductive layer is selected from the group consisting of aluminum, tin, gold, nickel, silver, copper and combinations and alloys thereof.

7. An apparatus as defined in claim 1 wherein said electrically conductive layer is foil.

8. An apparatus as defined in claim 1 wherein said substrate has a plurality of electrical components and said board-level electromagnetic interference (EMI) shield further comprises a plurality of compartments adapted to cover said plurality of electrical components.

9. An apparatus as defined in claim 1 wherein said at least one TCI material comprises an elastomer filled with thermally conductive particles.

10. An apparatus as defined in claim 1 further comprising a heat sink.

11. An apparatus as defined in claim 10 wherein said board-level electromagnetic interference (EMI) shield comprises at least one opening and wherein said at least one thermally conductive interface (TCI) material at least partially passes through said at least one opening and makes physical contact with both said heat sink and said at least one component.

12. An apparatus as defined in claim 11 further comprising an electrically conductive surface on said heat sink and an EMI gasket, wherein said EMI gasket is in electrical contact with said electrically conductive layer of said board-level EMI shield and said electrically conductive surface of said heat sink, and substantially surrounding said at least one opening.

13. An apparatus as defined in claim 11 further comprising an electrically conductive surface on said heat sink, and wherein said at least one thermally conductive interface (TCI) material substantially covers said at least one opening, and wherein said at least one TCI material is also electrically conductive, and wherein said electrically conductive TCI material is in electrical contact with said electrically conductive surface on said heat sink and said electrically conductive layer of said board-level electromagnetic interference (EMI) shield.

14. An apparatus comprising:
   (a) a substrate having at least one electrical component disposed thereon;
   (b) a plurality of solder spheres disposed on said substrate surrounding said at least one electrical component;
   (c) a board-level electromagnetic interference (EMI) shield comprising at least one compartment adapted to cover said at least one electrical component, said board-level EMI shield further comprising an electrically conductive layer;
   (d) at least one thermally conductive interface (TCI) material disposed over said at least one electrical component;
   (e) a heat sink disposed over said at least one TCI material;
   (f) wherein said electrically conductive layer of said board-level EMI shield is in electrical contact with at least one of said solder spheres, and wherein said board-level EMI shield and said solder spheres combine to limit electromagnetic radiation from entering or exiting said at least one compartment; and
   (g) wherein said heat sink and said at least one TCI material combine to dissipate heat from said at least one electrical component.

15. A board-level electromagnetic interference (EMI) shield for a substrate having at least one electrical component disposed thereon and a plurality of discrete electrically conductive fastening units disposed in a pattern on the substrate surrounding the at least one electronic component, the board-level EMI shield comprising:
   (a) an electrically conductive layer;
   (b) a plurality of apertures formed in said board-level EMI shield such that said apertures correspond to the pattern of the electrically conductive fastening units;
   (c) at least one thermally conductive interface (TCI) material attached to said board-level EMI shield;

(d) wherein at least one of said apertures has a contact region and wherein said electrically conductive layer of said board-level EMI shield at said contact region of said aperture are deflectable to the extent necessary to allow said contact region to engage and retain at least one of said electrically conductive fastening units; and (e) wherein said electrically conductive layer of said EMI shield at said contact region is adapted to make electrical contact with at least one said electrically conductive fastening unit.

* * * * *